(12) United States Patent
Nakamura

(10) Patent No.: US 6,177,820 B1
(45) Date of Patent: Jan. 23, 2001

(54) PHASE-LOCKED LOOP USING A RANDOM-ACCESS MEMORY

(75) Inventor: Tsutomu Nakamura, Saitama (JP)

(73) Assignee: NEC Corporation, Tokyo (JP)

(*) Notice: Under 35 U.S.C. 154(b), the term of this patent shall be extended for 0 days.

(21) Appl. No.: 09/348,680

(22) Filed: Jul. 6, 1999

(30) Foreign Application Priority Data

Jul. 6, 1998 (JP) .................................................. 10-190712

(51) Int. Cl.[7] .................................................. H03L 7/06
(52) U.S. Cl. .......................... 327/159; 327/150; 327/106; 331/34
(58) Field of Search .................................. 327/156, 159, 327/147, 150, 142, 100, 105, 106; 331/10, 16, 14, 34

(56) References Cited

U.S. PATENT DOCUMENTS 5,673,004 * 9/1997 Park ...................................... 331/1 A
5,894,246 * 4/1999 Barnett et al. ........................ 331/10

* cited by examiner

Primary Examiner—Dinh T. Le
(74) Attorney, Agent, or Firm—McGuireWoods LLP

(57) ABSTRACT

A phase-locked loop (PPL) utilizing a RAM is disclosed. The RAM is provided to store a reference clock and a clock to be controlled. The PLL further comprises a voltage-controlled oscillator section controls a phase of the clock to be controlled. The PLL further comprises a controller for retrieving, from the RAM, data of said reference clock and said clock to be controlled. The controller determines a phase difference between said reference clock and said clock to be controlled. Additionally, the controller generating a control signal so as to reduce said phase difference and applying said control signal to said voltage-controlled oscillator section.

13 Claims, 13 Drawing Sheets

PHASE-LOCKED LOOP USING A RANDOM-ACCESS MEMORY

BACKGROUND OF THE INVENTION

1. Field of the Invention

The present invention relates generally to a phase-locked loop (PLL), and more specifically to a PLL using a random access memory.

2. Description of the Related Art

It is known in the art that a PLL is essentially a closed loop electric servomechanism whose output is locked onto, and will track a reference signal.

Before turning to the present invention, it is deemed advantageous to briefly describe, with reference to FIG. 1, a conventional PLL.

A PLL 10, shown in FIG. 1, is comprised of a phase detector 12, a control voltage generator 14, a voltage-controlled oscillator (VCO) 16, and a frequency divider (or frequency demultiplier) 18. A reference clock CLK0 is fed to the phase detector 12 which also receives a clock CLK2 from the frequency divider 18. The phase detector 12 compares the phases of the two clocks CLK0 and CLK2, and generates an error signal which is proportional to the phase difference between the two clocks. Although not shown in FIG. 1, the error signal is typically filtered by a loop filter (low-pass filter) and is applied to the control voltage generator 14 whose output is adjusted to generate a clock CLK1 from the VCO 16 with a predetermined clock rate (frequency). The clock CLK1 is applied to an external circuit (not shown) and to the frequency divider 18. Assuming that a divide value of the frequency divider 18 is Nv, then the frequency of the clock CLK1 is expressed by Nv multiplied by the frequency of the reference clock CLK0.

The above-mentioned conventional PLL has failed to pay any attention to the quality of the reference clock CLK0. In other words, the PLL of FIG. 1 is unable to determine the quality of the reference clock CLK0. Therefore, the PLL of FIG. 1 has suffered from the following difficulties. That is, the output clock CLK1 is undesirably deteriorated in the case where the clock rate of the reference clock CLK0 becomes unstable, and in the case where the wave-form of the reference clock CLK0 is disturbed due to noises superimposed thereon, and in the case where the reference clock CLK0 is instantaneously terminated.

SUMMARY OF THE INVENTION

It is therefore an object of the present to provide a PLL which utilizes a random-access memory (RAM).

Another object of the present invention is to provide a PLL which makes use of a random-access memory and is able to generate a clock signal which is stable against undesirably disturbed reference clock.

In brief, these objects are achieved by a phase-locked loop (PLL) utilizing a RAM is disclosed. The RAM is provided to store a reference clock and a clock to be controlled. The PLL further comprises a voltage-controlled oscillator section controls a phase of the clock to be controlled. The PLL further comprises a controller for retrieving, from the RAM, data of said reference clock and said clock to be controlled. The controller determines a phase difference between said reference clock and said clock to be controlled. Additionally, the controller generating a control signal so as to reduce said phase difference and applying said control signal to said voltage-controlled oscillator section.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

An embodiment of the present invention will be described with reference to the accompanying drawings.

Figure 1:
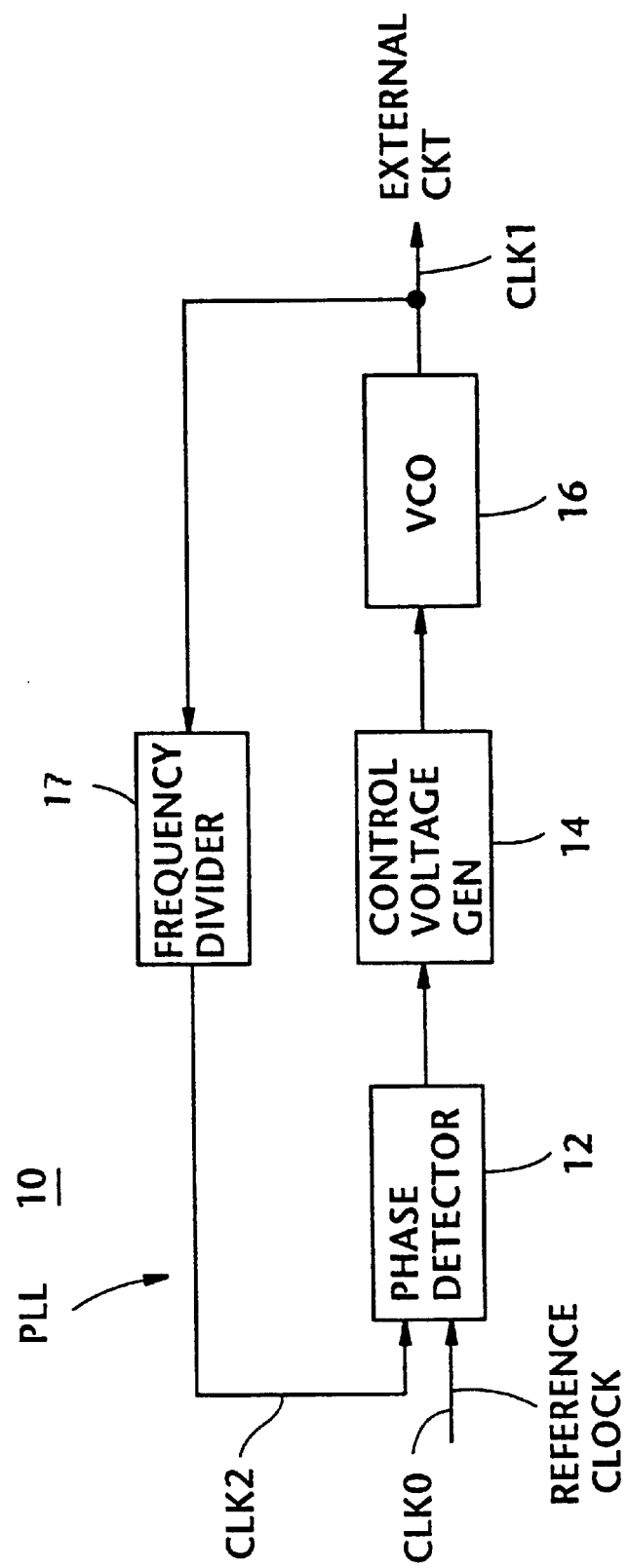
FIG. 1 is a diagram showing a conventional PLL in block diagram form.
Figure 2:
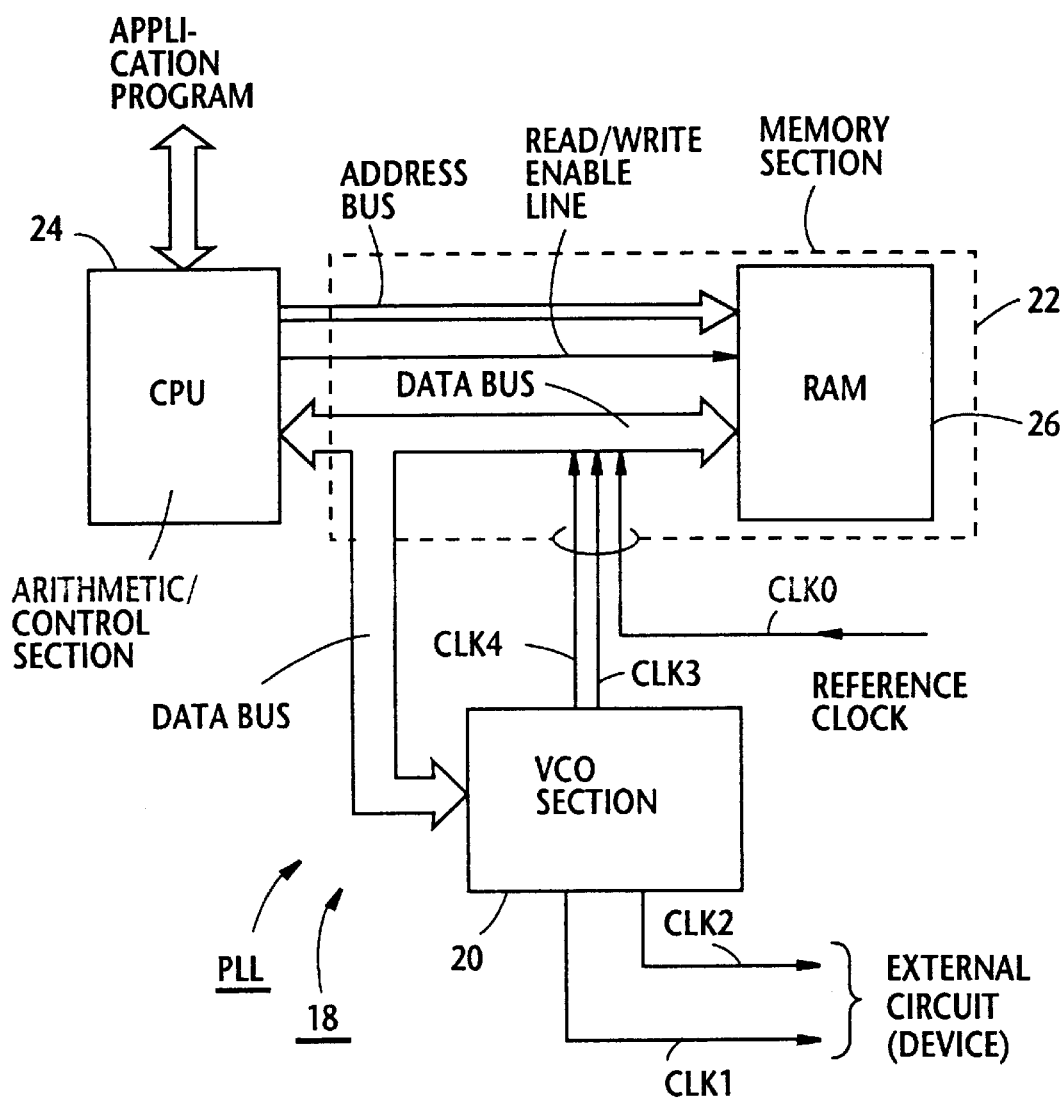
FIG. 2 is a block diagram showing a concept of a PLL according to the present invention.

Referring to FIG. 2, there is schematically shown a PLL 18 according to the preferred embodiment of the present invention. As shown in FIG. 2, the PLL 18 is generally comprised of three functional sections; a VCO section 20, a memory section 22, and an arithmetic/control section 24 which typically takes the form of a central processing unit (CPU). For the sake of simplifying the instant description, the arithmetic/control section 24 is usually referred to as a CPU. The CPU 24 controls the overall operation of the PLL 18 using an application program that has been stored in a suitable storage device.

During a data write cycle of the memory section 22, a reference clock CLK0 is written into a random-access memory (RAM) 26 together with two clocks CLK3 and CLK4 which are outputted from the VCO section 20. Additionally, during this memory write cycle, the CPU 24 writes VCO control data into the RAM 26. This VCO control data has been determined during the preceding RAM read cycle.

On the other hand, during the RAM read cycle which follows the above-mentioned RAM write cycle, the VCO control data stored in the RAM 26 is read out therefrom and is applied to the VCO section 20. Further, during the RAM read cycle, the CPU 24 retrieves the data of the clocks CLK0, CLK3 and CLK4 stored in the RAM 26, and calculates the phase differences between the clock CLK0 and each of the clocks CLK3 and 4. The CPU 24 determines the VCO control data using the just calculated phase differences. The VCO control data thus determined is written into the RAM 16 during the following RAM write cycle.

As shown in FIG. 2, two clocks CLK1 and CLK2 are available at the output of the VCO section 20. However, it is to be noted that the PLL of FIG. 2 can be modified without difficulty so as to output a single clock or more than two clocks.

Figure 3:
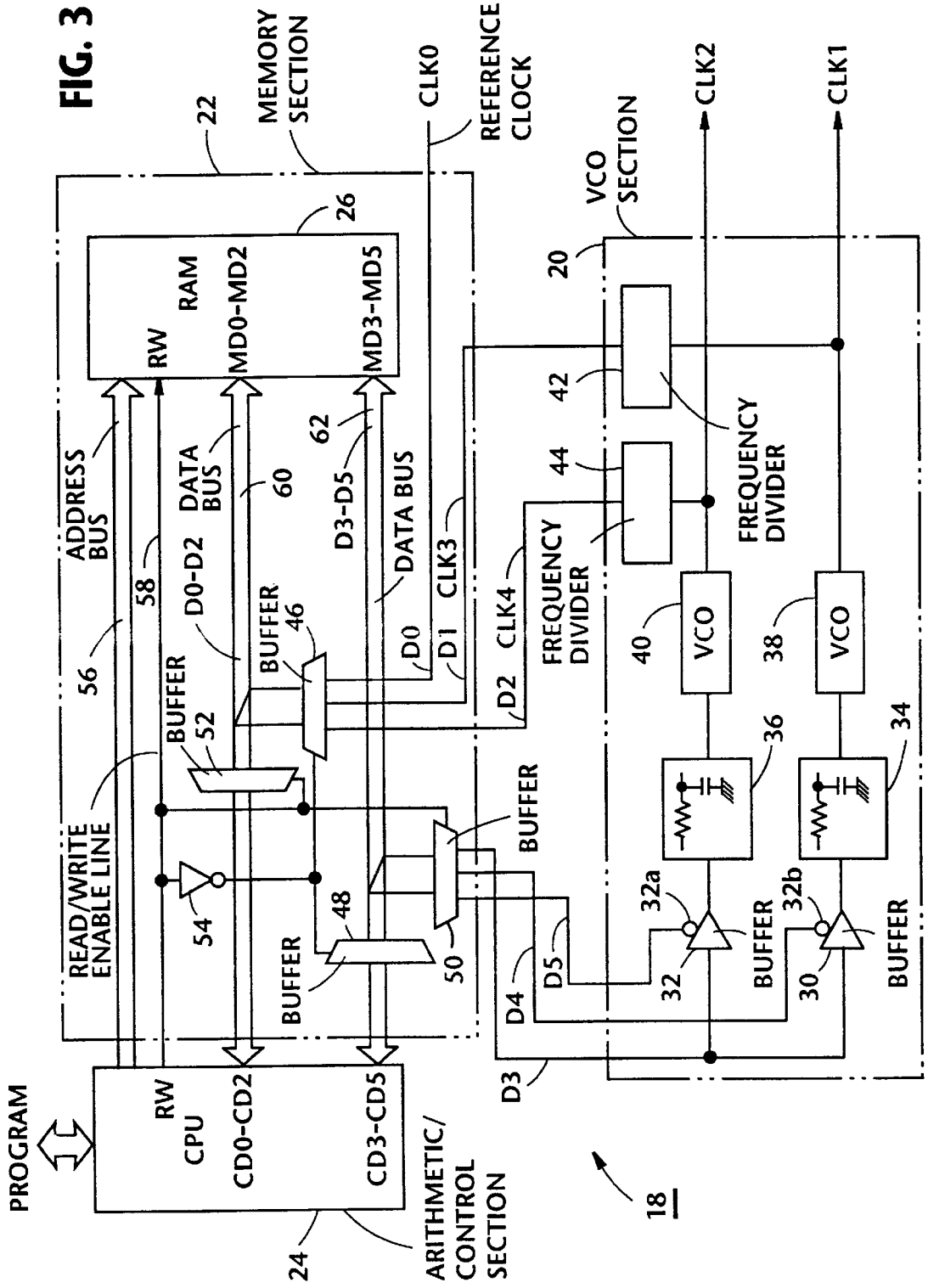
FIG. 3 is a block diagram showing in detail an arrangement of a PLL shown in FIG. 2.

Referring to FIG. 3, the PLL 18 of FIG. 2 is illustrated in detail in block diagram form. As shown, the VCO section 20 comprises two buffers 30 and 32, two loop filters 34 and 36, two VCOs 38 and 40, and two frequency dividers 42 and 44. On the other hand, the memory section 22 comprises, in addition to the RAM 26, four buffers 46, 48, 50 and 52, and an inverter 54. The RAM 26 is operatively coupled to CPU 24 by way of an address bus 56, a read/write enable line 58, and two data buses 60 and 62. The data bus 60 comprises, in this particular embodiment, three data lines D0–D2 while the other data bus 62 comprises three data lines D3–D5.

The operation of the arrangement of FIG. 3 will be described with reference to FIGS. 4–13.

The CPU 24 is programmed such as to alternately implement write and read operations on the RAM 26 which comprises a predetermined number of memory areas which are dedicated to the phase-locked loop operation. More specifically, the RAM write operation is carried out continuously from the first memory address to the last one. After the last memory address is accessed for data writing, the RAM read operation is initiated which is implemented continuously from the first memory address to the last one. Such one set of write and read operations is iterated as long as the phase-lock operation continues. Each of the write and read operations is made asynchronously with the reference clock CLK0.

Figure 4:
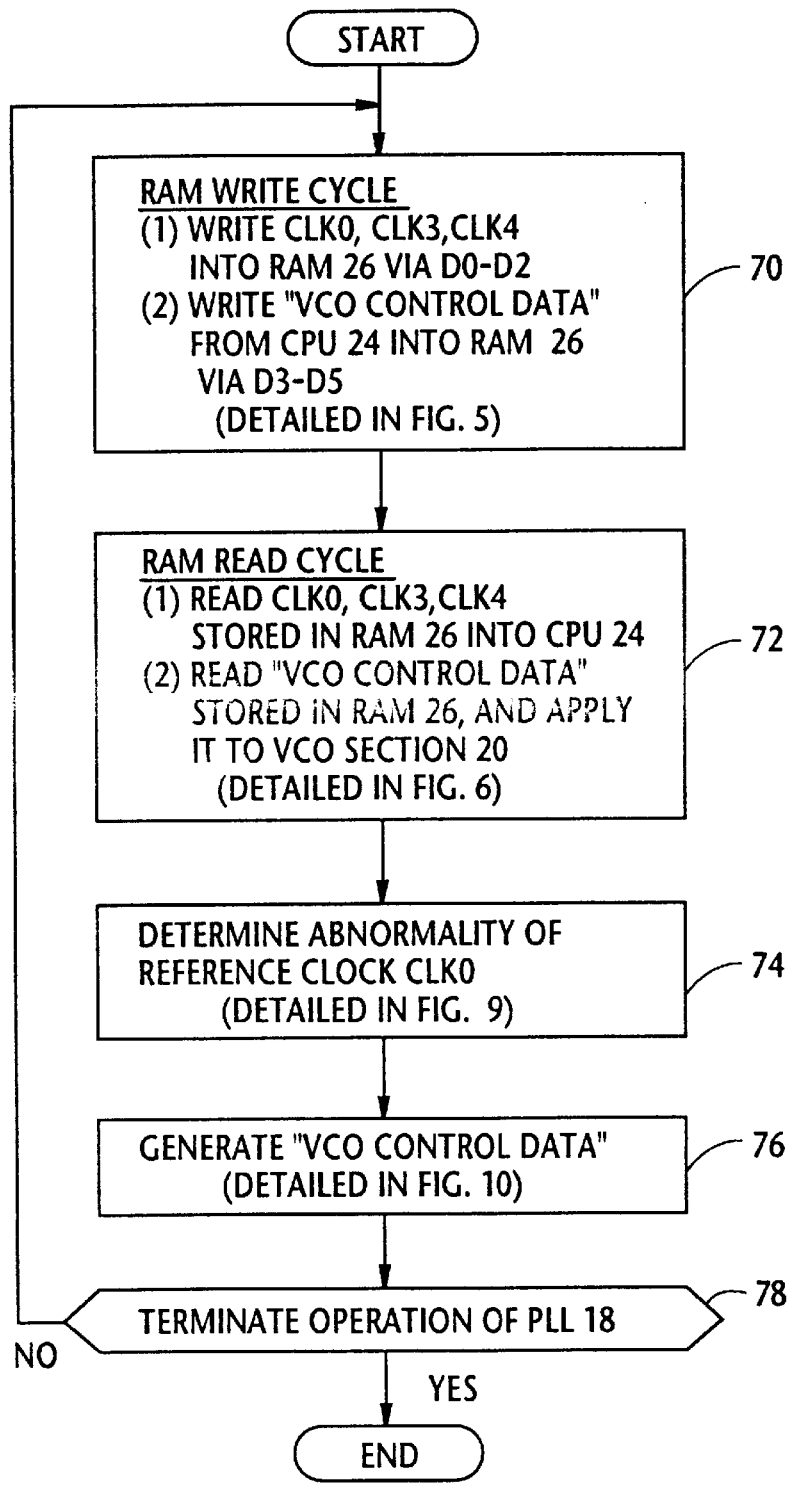
FIGS. 4–10 are each a flow chart which shows the steps which characterize the operations according to the embodiment of the present invention.

Referring to FIG. 4, when the program is initiated, the CPU 24 sets the RAM 26 into a data write mode (step 70). During the RAM write mode (operation), a read/write signal appearing at the read/write enable line 58 assumes a low logic level "0". Therefore, each of the buffers 46 and 48, in response to a high logic level "1" of read/write signal applied thereto via the inverter 54, generates the data therefrom. In other words, the high level of the read/write signal allows each of the buffers 46 and 47 to issue the content thereof. On the contrary, each of the buffers 50 and 52 responds to the read/write signal assuming a logic "1" and exhibits high impedance at the output thereof. This means that each of the buffers 50 and 52 blocks the data flow. During the RAM write cycle, the clocks CLK0, CLK3 and CLK4 are written into the RAM 26 through the buffer 46, the data bus 60, and terminals MD0–MD2. At the same time, the CPU 24 writes VCO control data, which has been determined by CPU 24 during the previous RAM read cycle, into the RAM 26 by way of terminal CD3–CD5 and MD3–MD5.

Figure 5:
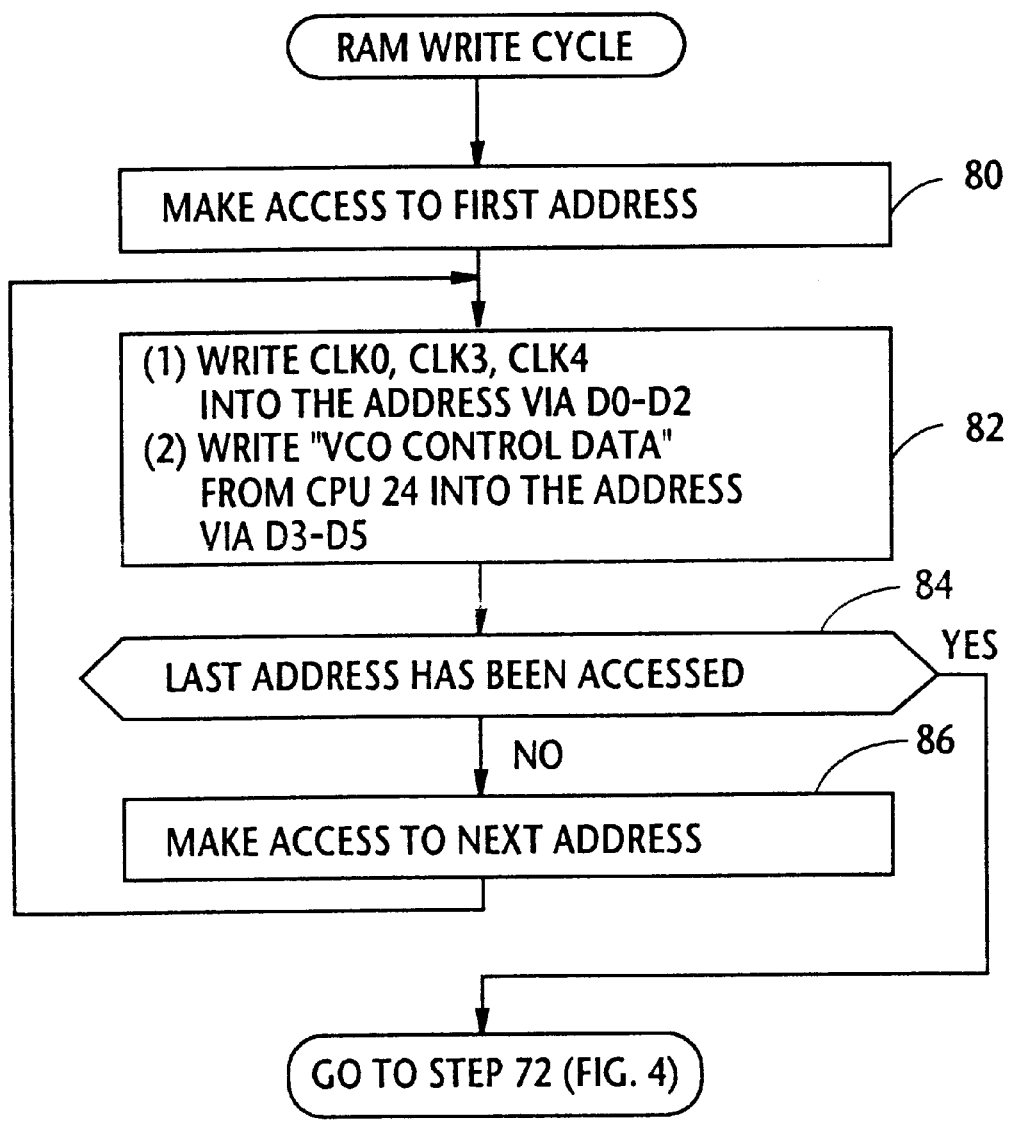

FIG. 5 is a flow chart which shows the steps which characterize the RAM write cycle. At step 80, the CPU 24 makes access to the first memory address using the address bus 56. The logic level of each of the clocks CLK0, CLK3 and CLK4, at the time point when the CPU 24 instructs the data acquisition, is written into the first address (step 82). More specifically, the high level of each clock is stored as a logic "1", while the low level of each clock is stored as a logic "0". At the same time, at step 82, the CPU writes the first set (3 bits) of the VCO control data into the first address via the control data lines D3–D5. It should be noted that at the first RAM write cycle, there is no VCO control data stored in the CPU 24 and thus no VCO control data is written into the RAM 26.

Each of the notations D3–D5 denotes the control data line. However, in order to simplify the instant disclosure, each of D3–D5 is sometimes used to imply the control data itself.

At step 84, a check is made to determine if the last address has been accessed. If the answer to the inquiry is negative, the program goes to step 86 at which the next address is accessed. Thereafter, the program returns to step 82. On the other hand, it the answer to the inquire at step 84 is affirmative, the routine goes to step 72 of FIG. 4.

Figure 11:
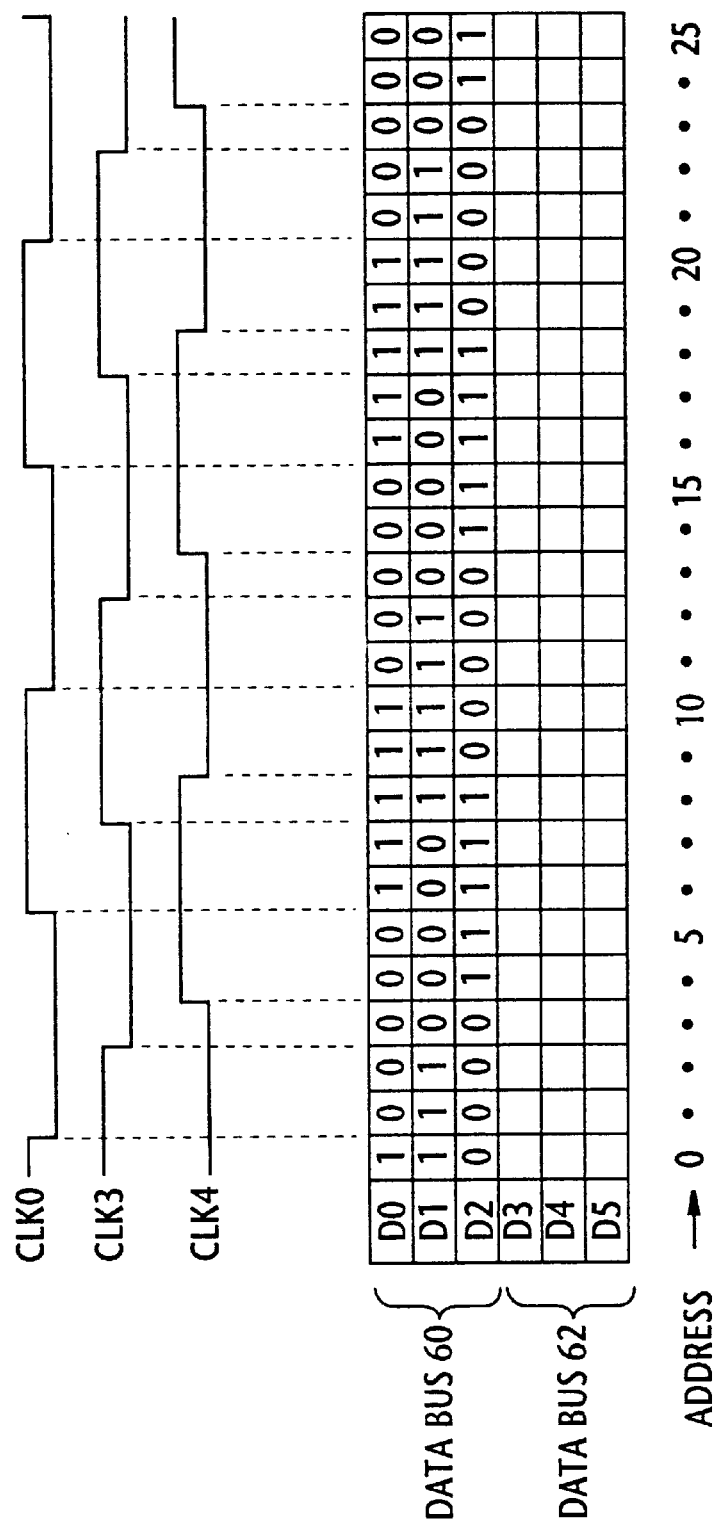
FIGS. 11–13 are diagrams showing the operation according to the preferred embodiment of the present invention.

For a better understanding of the first RAM write operation, reference is made to FIG. 11. It is assumed that the number of address areas dedicated to storing the VCO control data is only 26 merely for simplifying the drawing. It is understood that the clocks CLK0, CLK3 and CLK4 are successively written into the memory areas respectively specified by address 0 to 25. As mentioned above, at the first RAM write cycle, there is no VCO control data stored in the CPU 24 and thus no VCO control data is written into the RAM 26.

After completing the first RAM write operation (step 70 of FIG. 4), the RAM read cycle is initiated at step 72. Since the details of the operation at step 72 are shown in FIG. 6, reference is now made to FIG. 6.

Figure 6:
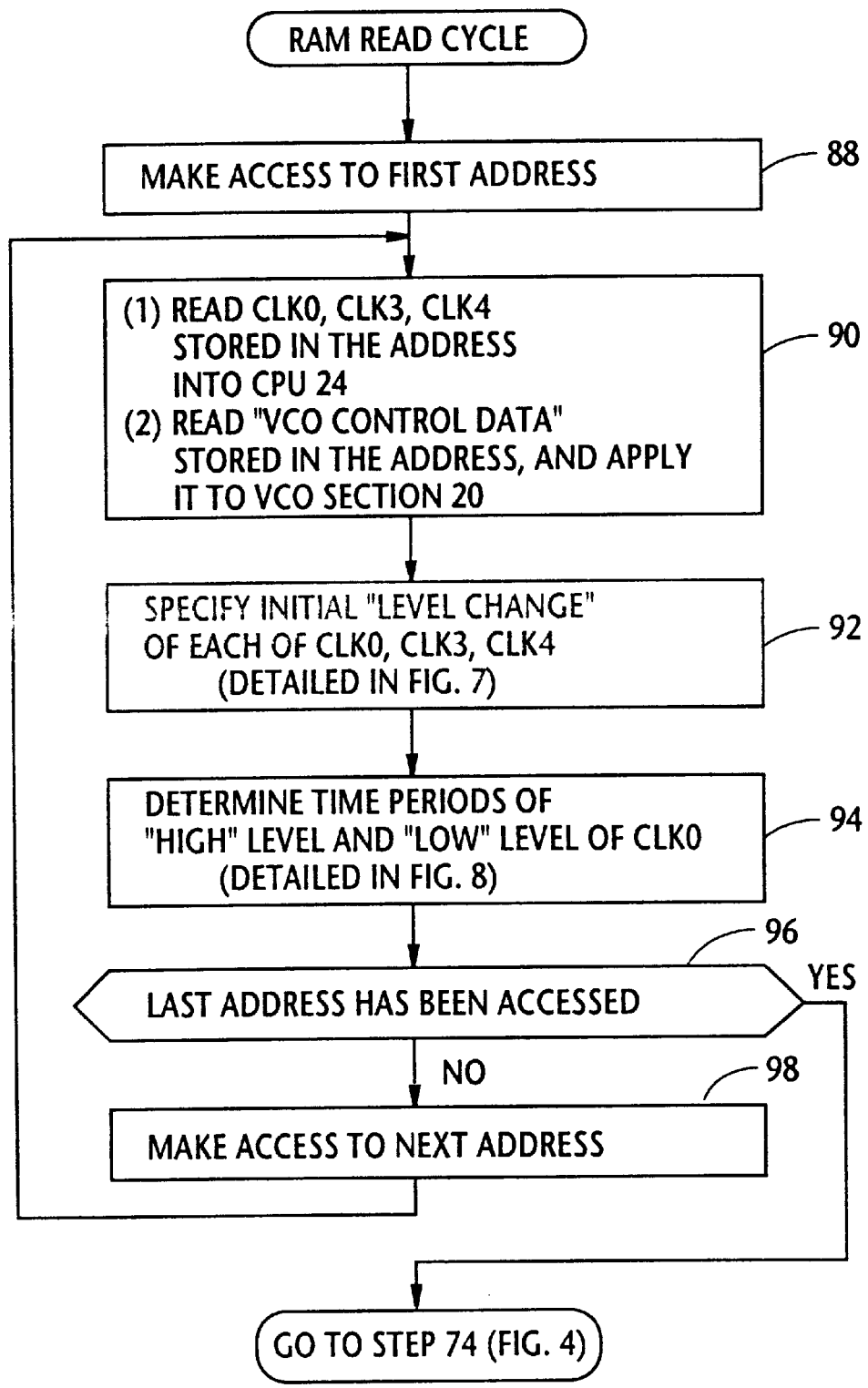
Figure 7:
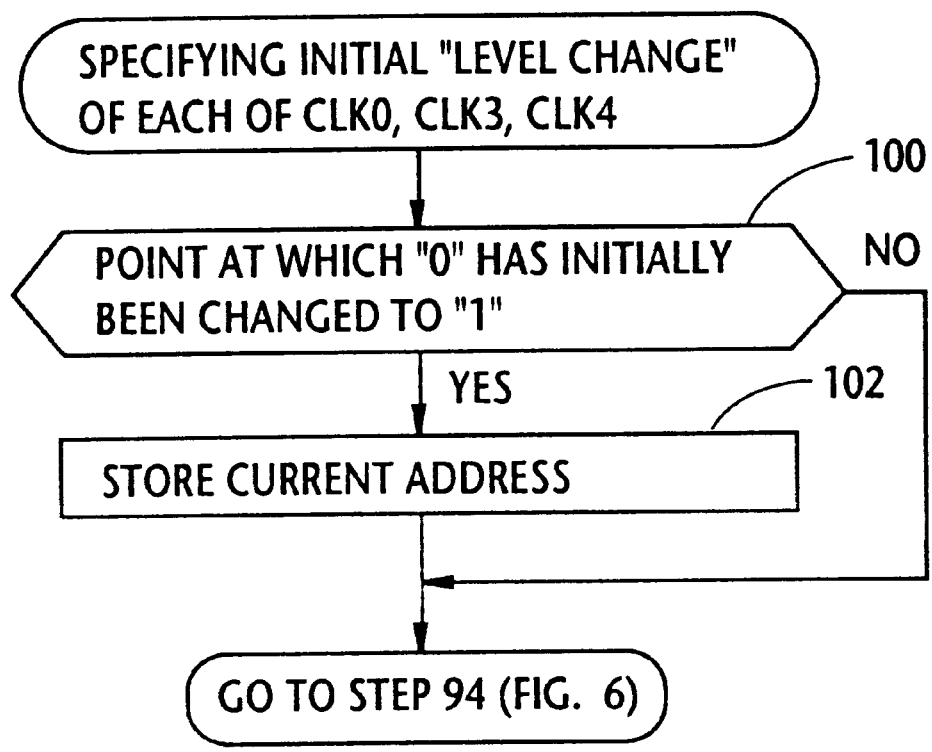

FIG. 6 is a flow chart which shows the steps which characterize the RAM read cycle. During the RAM read mode (operation), a read/write signal appearing at the read/write enable line 58 assumes a high logic level "0". Therefore, each of the buffers 50 and 52, in response to a high logic level "1" of read/write signal applied thereto, outputs the data therefrom. In other words, the high level of the read/write signal allows each of the buffers 50 and 52 to issue the content thereof. On the contrary, each of the buffers 46 and 48 responds to the read/write signal assuming a logic level "0" and exhibits high impedance at the output thereof. This means that both of the buffers 46 and 48 block the data flow. During the RAM read cycle, the data of the clocks CLK0, CLK3 and CLK4 all stored in the RAM 26 are successively read into the CPU 24 through the terminals MD0–MD2, the data bus 60, the buffer 52, and terminals CD0–CD2 (steps 90, 96, and 98). At the same time, the VCO control data, which has been stored in the RAM 26 during the previous RAM write cycle, are applied to the buffers 30 and 32 by way of terminal MD3–MD5 and the buffer 50 and the control data lines D3–D5 (steps 90, 96, and 98). It is understood from the foregoing that, in the case of the first RAM read cycle, there is no VCO control data which has been stored in the RAM 26 during the previous RAM write cycle.

Figure 12:
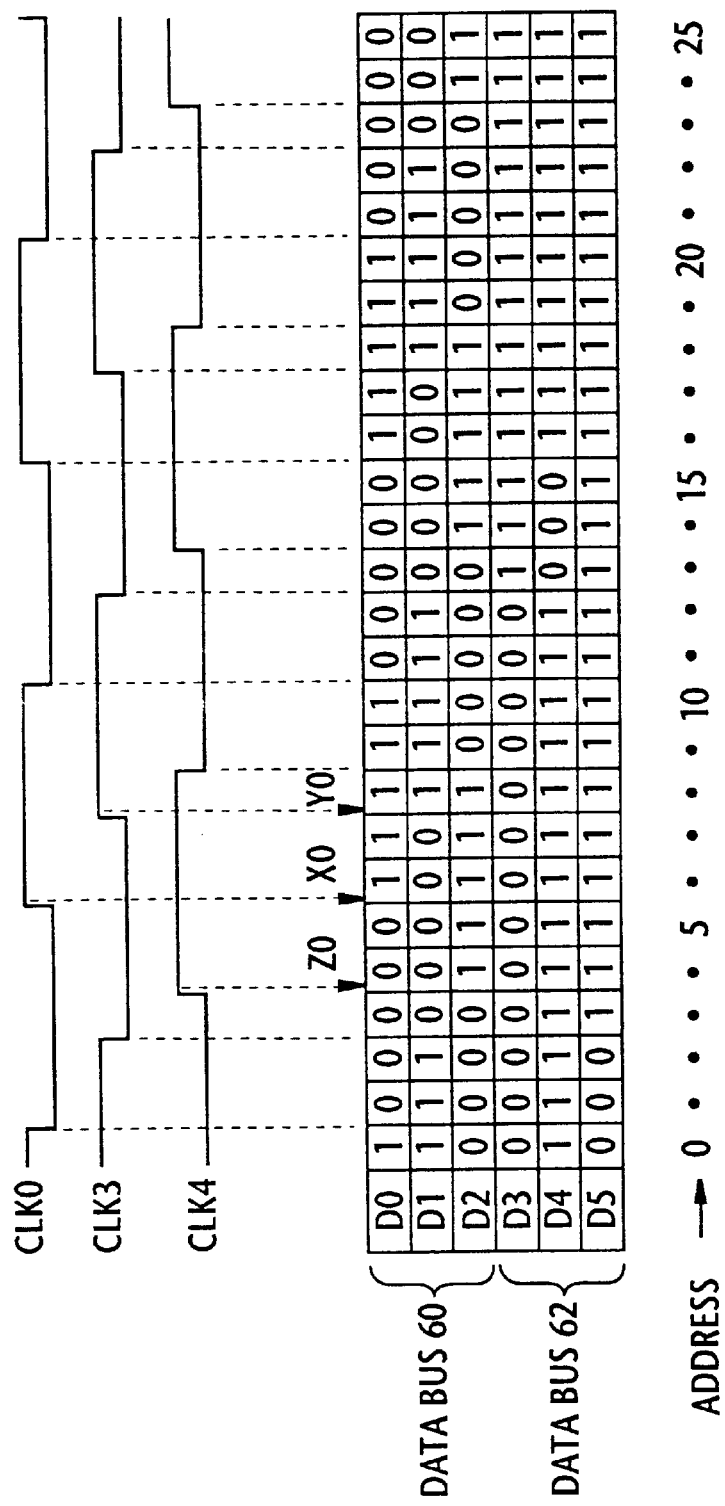

At step 92 of FIG. 6, the CPU 24 determines the initial level change ("0"→"1" (for example)) of each of the clocks CLK0, CLK3 and CLK4. This operation is described in detail with reference to FIGS. 7 and 12. The CPU 24 checks to see if the data of each of the clocks CLK0, CLK3 and CLK4, which is currently acquired from one address of the RAM 26, assumes a logic level "1" for the first time (step 100). This is done by comparing the current data with the previously acquired clock data. If the current data indicates the initial occurrence of level change, the address is stored in the CPU 24. Contrarily, if the answer to the inquiry made at step 100 is found negative, the routine goes to step 94 of FIG. 6. FIG. 12 shows that the addresses, at which the initial level changes ("0"→"1") of the clocks CLK0, CLK3 and CLK4 occur, are respectively denoted by X0, Y0 and Z0. These data are used to generate the VCO control data at step 76 of FIG. 4.

Figure 8:
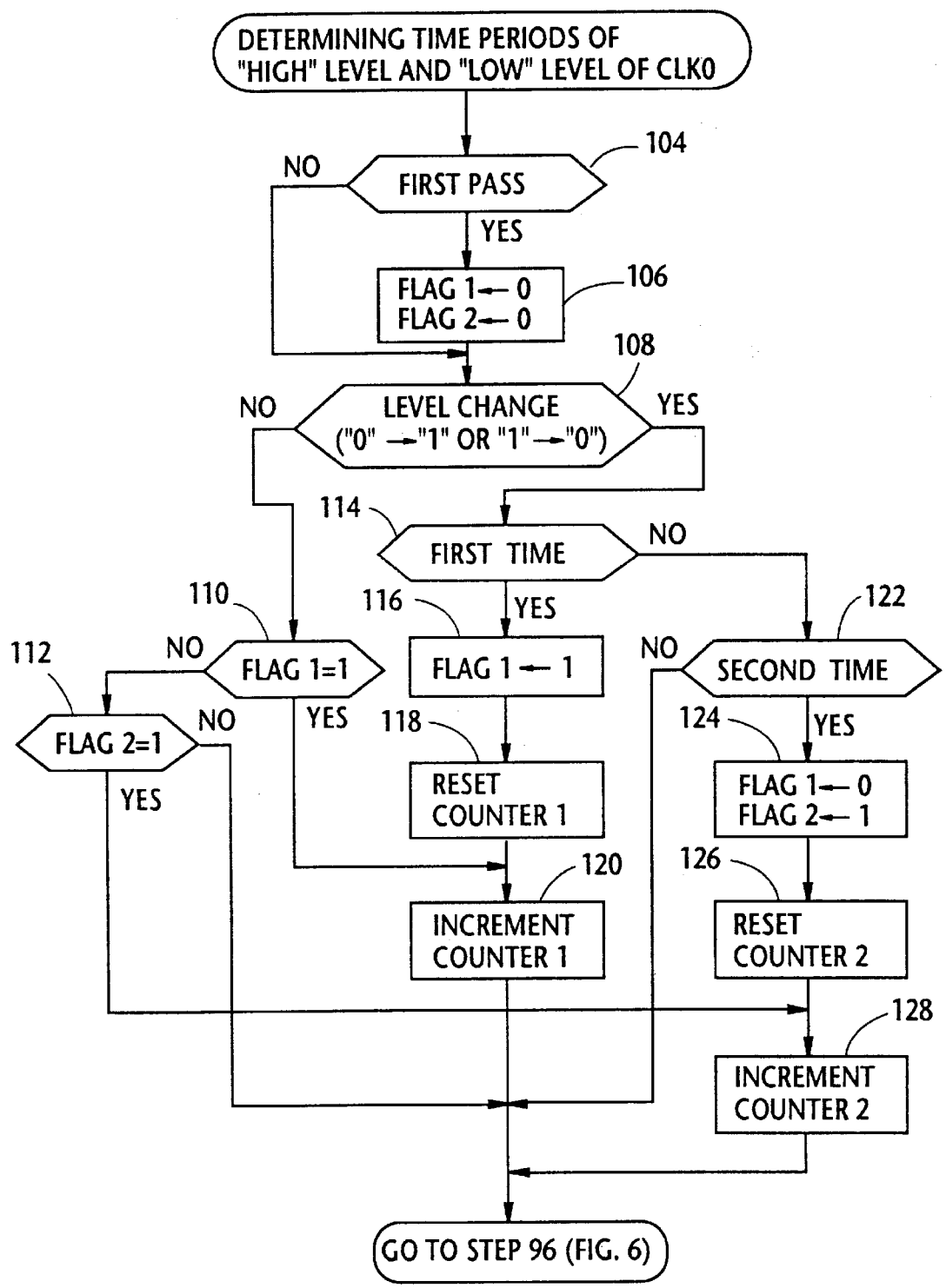

At step 94 of FIG. 6, the CPU 24 determines a time period of each of high and low levels of the clock CLK0. The CPU 24 calculates the time period by counting the number of continuously occurring "0"s and "1"s of the data which has been retrieved via the data line D0 from the RAM 26. The flow chart for determining the above mentioned time periods is shown in FIG. 8 that shows steps 104–128. The time periods of the high and low levels of the clock CLK 0 can be specified using the contents of counter 1 and 2 (steps 120 and 126 of FIG. 8). The operation of determining the time period is quite simple, and thus the further description of flow chart of FIG. 8 will be omitted merely for simplifying the instant disclosure.

Figure 9:
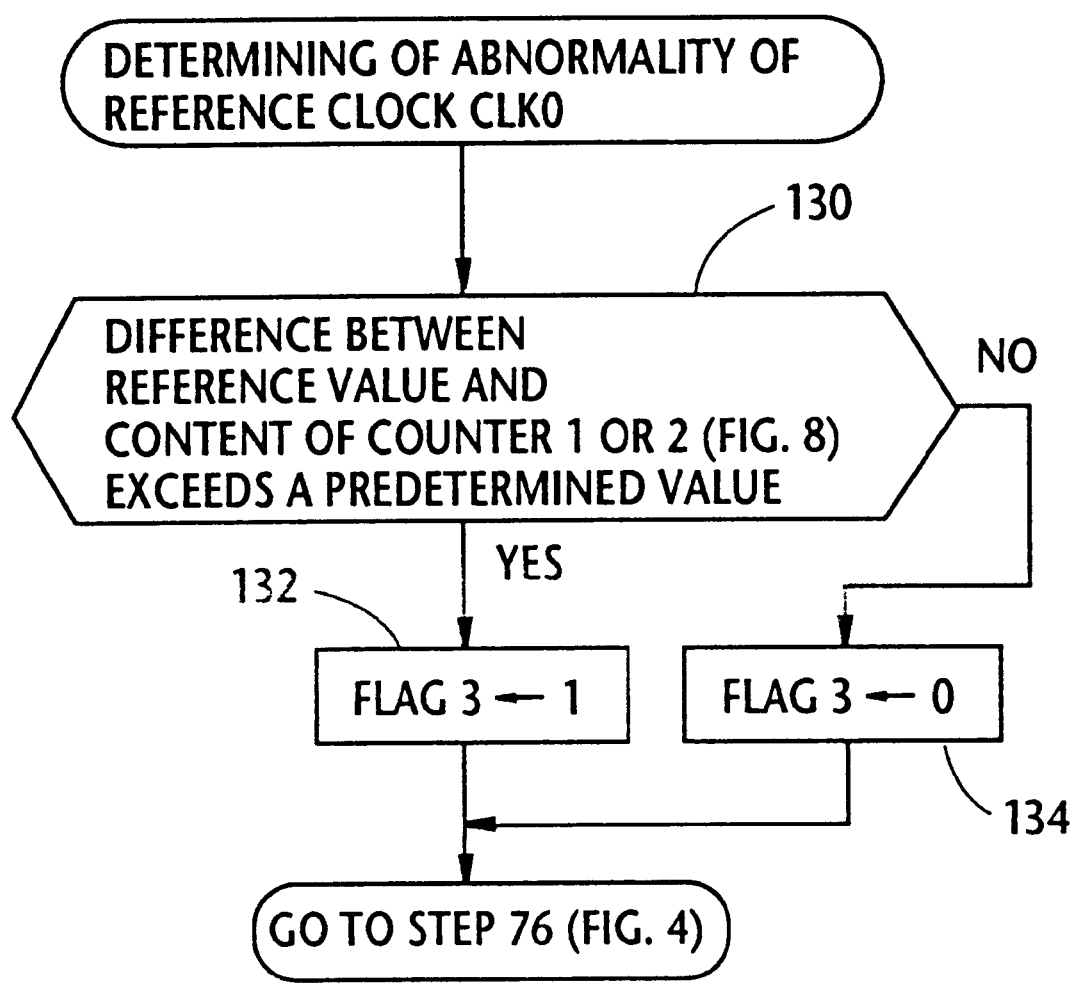

The operation of determining abnormality of the reference clock CLK0, which is implemented at step 74 of FIG. 4, will be described with reference to FIG. 9. At step 130 of FIG. 9, each of the contents of the counters 1 and 2 (FIG. 8) is compared with a reference value. If the comparison result falls out of a predetermined range (±1 (for example)), it is determined that the reference clock CLK0 is in an abnormal state. In this case, the program goes to step 132 at which a flag 3 is set to a logic "1". Otherwise, a logic "0" is written into the flag 3. As mentioned above, the allowable range (viz., ±1) is prepared for determining the reference clock's abnormality. This is because, since the reference clock CLK0 is asynchronous with the write clock of the CPU 24, it if necessary to consider the error of one clock cycle. After implementing step 132 or 134, the routine proceeds to step 76 of FIG. 4.

Figure 10:
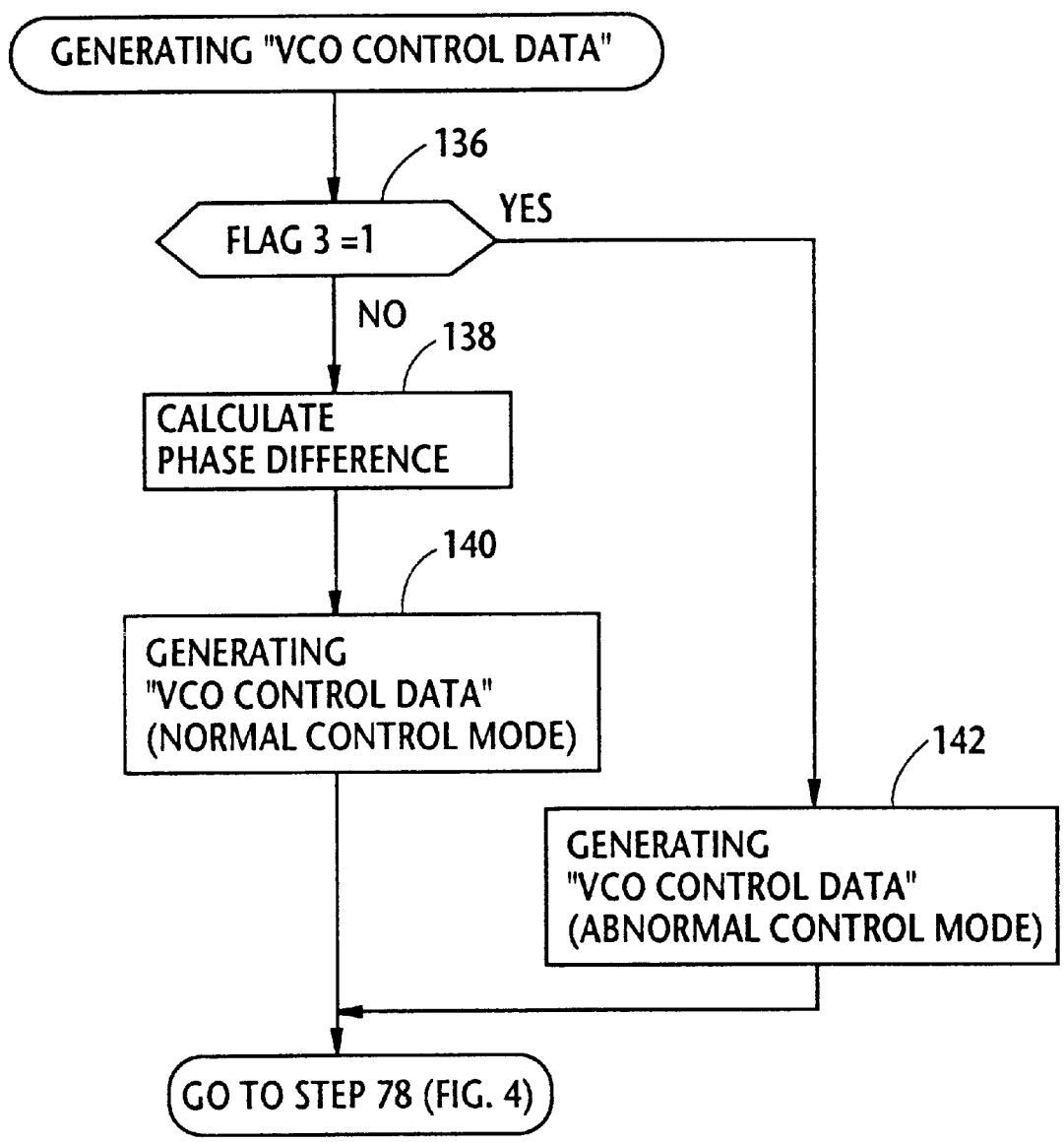

The operation of generating the VCO control data, which is carried out at step 76 of FIG. 4, will be described with reference to FIG. 10. As shown in FIG. 10, at step 136, a check is made to determine if the flag 3 (FIG. 9) has been set to a logic "1". If the answer is negative (this means that the reference clock CLK0 is not abnormal), the program goes to step 138 at which a phase difference between the clock CLK0 and each of the clocks CLK3 and CLK4 is calculated. The calculation of the phase difference will be described with reference to FIG. 12. As mentioned above, the addresses X0, Y0 and Z0 have been determined. In the case shown in FIG. 12, we obtain:

$$(Y0-X0)=+2 \text{ and } (Z0-X0)=-2$$

In the above, the positive value means that the clock to be checked lags relative to the reference clock, while the negative value means that the clock to be checked leads against the reference clock. Therefore, in the instant case, the CPU 24 should generate the VCO control data via which the clock CLK3 increases the clock rate thereof and via which the clock CLK4 lowers the clock rate thereof. Assuming that each of the VCOs 38 and 40 (FIG. 3) operates such as to increase and decrease the frequency of the output thereof if the control voltage applied thereto become high or low, respectively.

In order to generate the VCO control data in the case where the reference clock CLK0 is not abnormal (step 140), the CPU 24 writes the control data, associated with the line D3, in the RAM 26 as follows. That is, logic "0"s are written into one half of the overall addresses and takes logic "1"s in the other half. This manner is best shown in FIG. 12.

As above mentioned, each of D3–D5 is sometimes used to imply the control data itself.

The control data on the line D3 (viz., control data D3) is applied to the input terminals of the buffers 30 and 32. On the other hand, the control data D4 and D5 are respectively applied to control terminals 30a and 32a in order to control the operations of the buffers 30 and 32, respectively. In more specific terms, when a logic "1" is applied to the control terminal 30a or 32a, the corresponding buffer (30 or 32) exhibits a high impedance at the output thereof, which means that the operation of the corresponding VCO (38 or 40) is frozen. On the other hand, when a logic "0" is applied to the control terminal 30a or 32a, the corresponding buffer (30 or 32) allows the control data D3 (viz., control data on the line D3) to pass therethrough.

In order to compensate for the phase difference in the above case (viz., (Y0-X0)=2 and (Z0-X0)=-2), the CPU 24 generates three logic "0"s (at the addresses 13–15 (for example)) in the control data appearing on the line D4. Similarly, the CPU 24 generates three logic "0"s (at the addresses 0–2) in the control data appearing on the line D5. The number of logic "0"s is determined depending on the various circuit parameters. It is understood that the number of logic "0"s increases the extend of the value controlled. The manner as just mentioned is clearly shown in FIG. 12.

Figure 13:
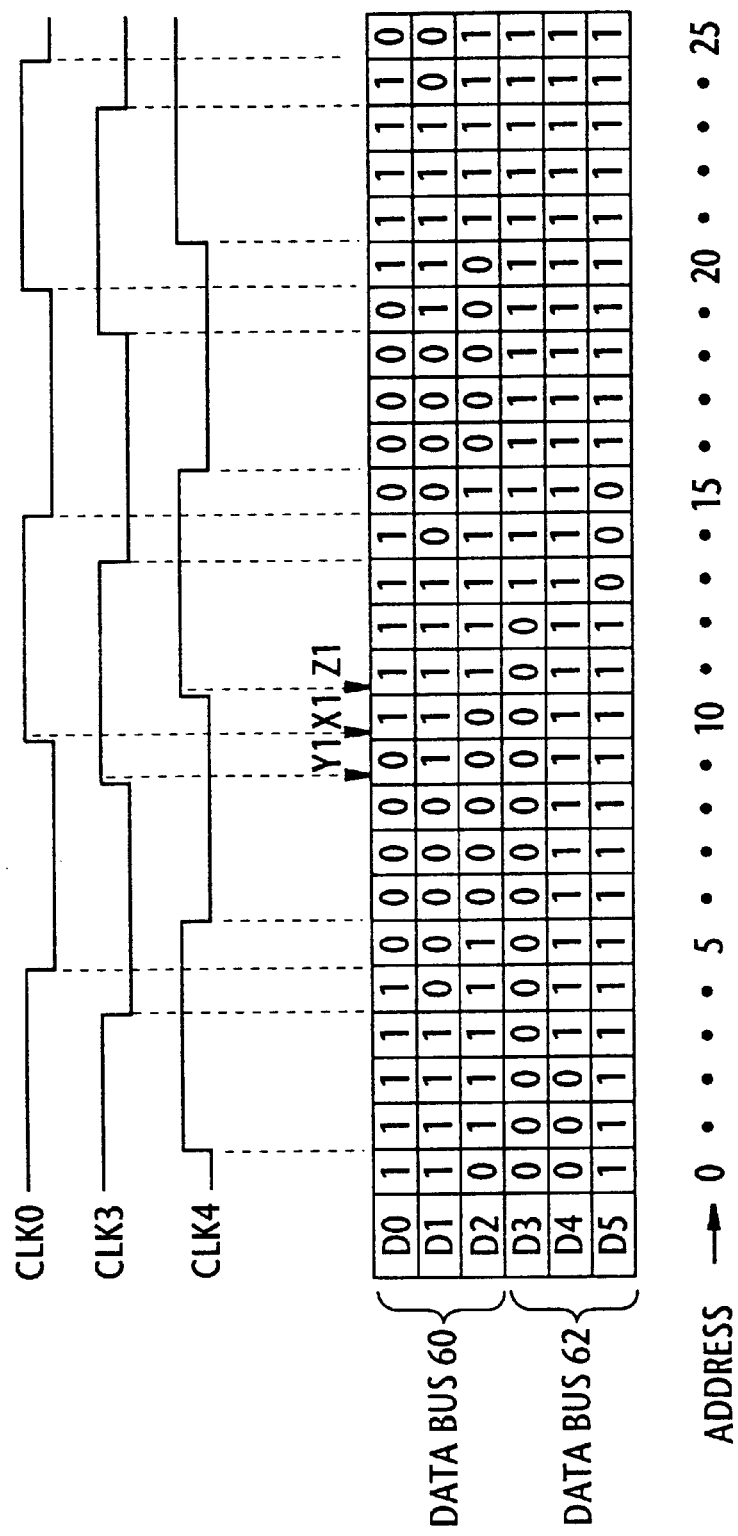

FIG. 13 shows that after the above mentioned phase control, the clock CLK3 lags against the reference clock CLK0 while the other clock CLK4 leads relative to CLK0. That is, the lagging and leading relations in the case of FIG. 12 are reversed after the phase control. The control voltage applied to each of the VCOs 38 and 40 goes upward and downward alternately in order to lock the clocks CLK3 and CLK4 to the reference clock CLK0 within a predetermined narrow range.

In order to generate the VCO control data in the case where the reference clock CLK0 falls in an abnormal state (step 142), the CPU 24 writes a logic "1" in all the memory addresses of each of the control data D4 and D5. Therefore, when the VCO control data is read out of the RAM 26, both of the buffers 30 and 32 exhibit the high impedance at their output. Accordingly, each of the VCOs 38 and 40 are fixed in terms of their operations. It goes without saying that if the abnormal states is tereminated, the aforesaid normal VCO control is implemented. Therefore, if the abnormal state of the reference clock is instantaneous, it is possible to effectively prevent the PLL 18 from generating abnormal clocks therefrom.

In the above description, the PLL 18 is arranged such as to generate the two clocks CLK3 and CLK4. However, it is not difficult to modify the PLL 18 so as to generate a single clock or more than two clocks. Further, the PLL 18 comprises the two frequency dividers 42 and 44.

It will be understood that the above disclosure is representative of only one possible embodiment of the present invention and that the concept on which the invention is based is not specifically limited thereto.

What is claimed is:

1. A phase-locked loop for outputting an external clock signal comprising:
   a memory for storing a reference clock and a clock to be controlled, said clock to be controlled being generating from feedback from the external clock signal;
   a voltage controlled oscillator section for controlling a phase of said clock to be controlled; and
   a controller for retrieving, from said memory, data of said reference clock and said clock to be controlled, said controller determining a phase difference between said reference clock and said clock to be controlled, said controller generating a first control signal so as to reduce said phase difference and applying said first control signal to said voltage-controlled oscillator section.

2. A phase-locked loop for outputting an external clock signal comprising:
   a memory for storing a reference clock and a clock to be controlled, said clock to be controlled being generating from feedback from the external clock signal;
   a voltage controlled oscillator selection for controlling a phase of said clock to be controlled; and
   a controller for retrieving, from said memory, data of said reference a clock and said clock to be controlled, said controller determining a phase difference between said reference clock and said clock to be controlled, said controller generating a first control signal so as to reduce said phase difference and applying said first control signal to said voltage-controlled oscillator section,
   wherein said controller determines an abnormal state of said reference clock when said reference clock deviates in excess of a predetermined value, said controller applying, when said abnormal state occurs, a second control signal to said voltage-controlled oscillator so as to avoid an undesirable operation of said voltage-controlled oscillator which is caused by said abnormal state.

3. A phase-locked loop as claimed in claim 2, wherein said voltage-controlled oscillator stops operating in response to said second control signal.

4. A phase-locked loop as claimed in claim 1, wherein said memory has a plurality of memory positions, and data representing said reference clock and said clock to be controlled being successively sampled and stored into said plurality of memory positions.

5. A phase-locked loop as claimed in claim 1, wherein said controller alternately implements memory write and read cycles on said memory, said controller writing, during said memory write cycle, the data of said reference clock and said clock to be controlled into said memory, said controller further writing, during said memory write cycle, said first control signal into said memory which has been generated during a preceding memory read cycle, and wherein said controller retrieves, during said read cycle, the data of said reference clock and said clock to be controlled from said memory, said controller further retrieving, during said memory read cycle, said first control signal from said memory and applying said first control signal to said voltage-controlled oscillator.

6. A phase-locked loop for outputting an external clock signal comprising:

a memory for storing a reference clock and a clock to be controlled, said clock to be controlled being generating from feedback from the external clock signal;

a voltage controlled oscillator section for controlling a phase of said clock to be controlled; and a controller for retrieving, from said memory, data of said reference clock and said clock to be controlled, said controller determining a phase difference between said reference clock and said clock to be controlled, said controller generating a first control signal so as to reduce said phase difference and applying said first control signal to said voltage-controlled oscillator section, wherein said controller alternately implements memory write and read cycles on said memory, said controller writing, during said memory write cycle, the data of said reference clock and said clock to be controlled into said memory, said controller further writing, during said memory write cycle, said first control signal into said memory which has been generated during a preceding memory read cycle, and wherein said controller retrieves, during said read cycle, the data of said reference clock and said clock to be controlled from said memory, said controller further retrieving, during said memory read cycle, said first control signal from said memory and applying said first control signal to said voltage-controlled oscillator, wherein said controller determines an abnormal state of said reference clock when said reference clock deviates in excess of a predetermined value, said controller applying, when said abnormal state occurs, a second control signal to said voltage-controlled oscillator so as to avoid an undesirable operation of said voltage-controlled oscillator which is caused by said abnormal state.

7. A phase-locked loop as claimed in claim 6, wherein said voltage-controlled oscillator stops operating in response to said second control signal.

8. A phase-locked loop for outputting an external clock signal comprising:

a memory for storing a reference clock and a clock to be controlled, said clock to be controlled being generating from feedback from the external clock signal;

a voltage controlled oscillator section for controlling a phase of said clock to be controlled; and a controller for retrieving, from said memory, data of said reference clock and said clock to be controlled, said controller determining a phase difference between said reference clock and said clock to be controlled, said controller generating a first control signal so as to reduce said phase difference and applying said first control signal to said voltage-controlled oscillator section, wherein said controller alternately implements memory write and read cycles on said memory, said controller writing, during said memory write cycle, the data of said reference clock and said clock to be controlled into said memory, said controller further writing, during said memory write cycle, said first control signal into said memory which has been generated during a preceding memory read cycle, and wherein said controller retrieves, during said read cycle, the data of said reference clock and said clock to be controlled from said memory, said controller further retrieving, during said memory read cycle, said first control signal from said memory and applying said first control signal to said voltage-controlled oscillator, wherein said memory has a plurality of memory positions, and data representing said reference clock and said clock to be controlled being sampled and successively stored into said plurality of memory positions.

9. A method of generating an output from a phase-locked loop, a clock rate of said output being adjusted by tracking a reference clock applied to said phase-controlled loop, said method comprising the steps of:

(a) storing said reference clock and a clock to be controlled into a memory, said clock to be controlled being generated by feeding back said output;

(b) reading, from said memory, said reference clock and said clock to be controlled into a controller, and determining a phase difference between said reference clock and said clock to be controlled;

(c) generating, at said controller, a first control signal, using said phase difference, for adjusting the clock rate of said output;

(d) applying said first control signal to a voltage-controlled oscillator section; and (e) adjusting the clock rate of said output using said first control signal.

10. A method of generating an output from a phase-locked loop, a clock rate of said output being adjusted by tracking a reference clock applied to said phase-controlled loop, said method comprising the steps of:

(a) storing said reference clock and a clock to be controlled into a memory, said clock to be controlled being generated by feeding back said output;

(b) reading, from said memory, said reference clock and said clock to be controlled into a controller, and determining a phase difference between said reference clock and said clock to be controlled;

(c) generating, at said controller, a first control signal, using said phase difference, for adjusting the clock rate of said output;

(d) applying said first control signal to a voltage-controlled oscillator section;

(e) adjusting the clock rate of said output using said first control signal;

(f) determining, at said controller, an abnormal state of said reference clock when said reference clock deviates in excess of a predetermined value; and (g) applying, when said abnormal state occurs, a second control signal to said voltage-controlled oscillator from said controller so as to avoid an undesirable operation of said voltage-controlled oscillator which is caused by said abnormal state.

11. A method as claimed in claim 10, wherein, at step (g), said second control signal stops the operation of said voltage-controlled oscillator.

12. A method as claimed in claim 9, wherein, at step (a), successively sampling data representing said reference clock and said clock to be controlled, and successively storing the sampled data into a plurality of memory positions provided in said memory.

13. A method of generating an output from a phase-locked loop, a clock rate of said output being adjusted by tracking a reference clock applied to said phase-controlled loop, said method comprising the steps of:

(a) storing said reference clock and a clock to be controlled into a memory, said clock to be controlled being generated by feeding back said output;

(b) reading, from said memory, said reference clock and said clock to be controlled into a controller, and determining a phase difference between said reference clock and said clock to be controlled;

(c) generating, at said controller, a first control signal, using said phase difference, for adjusting the clock rate of said output;

(d) applying said first control signal to a voltage-controlled oscillator section;

(e) adjusting the clock rate of said output using said first control signal, wherein said controller alternately implementing memory write and read cycles on said memory, said controller writing, during said memory write cycle, the data of said reference clock and said clock to be controlled into said memory, said controller further writing, during said memory write cycle, said first control signal into said memory generated during a preceding memory read cycle, and wherein said controller retrieves, during said read cycle, the data of said reference clock and said clock to be controlled from said memory, said controller further retrieving, during said memory read cycle, said first control signal from said memory and applying said first control signal to said voltage-controlled oscillator.

* * * * *